United States Patent
Vallot (10) Patent No.: US 7,414,581 B2
(45) Date of Patent: Aug. 19, 2008

(54) METHOD FOR IMPROVED SIGNAL TO NOISE RATIO ESTIMATION

(75) Inventor: Lawrence C. Vallot, Shoreview, MN (US)

(73) Assignee: Honeywell International Inc., Morristown, NJ (US)

( * ) Notice: Subject to any disclaimer, the term of this patent is extended or adjusted under 35 U.S.C. 154(b) by 34 days.

(21) Appl. No.: 11/326,897

(22) Filed: Jan. 6, 2006

(65) Prior Publication Data

US 2007/0159392 A1 Jul. 12, 2007

(51) Int. Cl.
*G01S 3/52* (2006.01)
(52) U.S. Cl. .................................. 342/418; 375/227
(58) Field of Classification Search ............... 342/195, 342/417, 418, 420; 375/142, 148, 225, 227
See application file for complete search history.

(56) References Cited

U.S. PATENT DOCUMENTS

| | | | |
|---|---|---|---|
| 6,426,971 B1 * | 7/2002 | Wu et al. | 375/227 |
| 6,990,137 B2 * | 1/2006 | Smee et al. | 375/142 |
| 7,079,820 B2 * | 7/2006 | Bortnyk et al. | 455/133 |
| 2002/0005802 A1 | 1/2002 | Bryant et al. | |
| 2004/0196891 A1 * | 10/2004 | Tapaninen | 375/148 |
| 2006/0034401 A1 * | 2/2006 | Cho et al. | 375/345 |
| 2006/0211377 A1 * | 9/2006 | Shoemake et al. | 455/67.13 |
| 2007/0053452 A1 * | 3/2007 | Koo et al. | 375/260 |

FOREIGN PATENT DOCUMENTS

| | | |
|---|---|---|
| CA | 2527332 | 12/2004 |
| EP | 0471476 | 2/1992 |
| WO | 0182538 | 11/2001 |

* cited by examiner

*Primary Examiner*—Dao L Phan
(74) *Attorney, Agent, or Firm*—Black Lowe & Graham PLLC (57) ABSTRACT

A method for estimating signal/noise ratio is provided. The method comprises calculating a first signal/noise ratio (SNR) estimate using a technique with a first response time, calculating a second SNR estimate using a technique with a second, slower response time, and blending the first SNR estimate with the second SNR estimate.

24 Claims, 5 Drawing Sheets

METHOD FOR IMPROVED SIGNAL TO NOISE RATIO ESTIMATION

BACKGROUND

In the area of integrated navigation, it is common for a system to combine data from inertial navigation sensors with data received from Global Positioning System (GPS) satellites, or more generally, Global Navigation Satellite Systems (GNSS). A common method used for combining these two sources of data is the use of the Kalman filter algorithm. The Kalman filter algorithm has been in use in integrated navigation systems for over 20 years. The filter blends GPS signal data with inertial navigation data by primarily depending on GPS signals for long term accuracy and inertial navigation data for short time frames. Hence, the navigation system has the low noise and short-term accuracy of the inertial sensors, while not suffering from integration drift common to inertial navigation data because the navigation system depends on GPS signals for long time frame calculations.

In combining the two sources of data, it is desirable to know the quality of the GPS measurements. If the GPS signals are suffering from high levels of interference, such as from jamming, the GPS measurements should in most circumstances be weighted less in the combination with the low noise inertial sensor data. If, however, the GPS signal is suffering from little noise and thus very accurate, the GPS measurements should in most circumstances be weighted more in the combination of the two data sources. It is common, therefore, for a GPS receiver to include a low pass time constant filtered estimator which calculates a signal power to noise power ratio (SNR), or alternatively a carrier power to noise power spectral density ($C/N_o$) ratio, for each GPS satellite being tracked. However, typical time constant filtered estimators respond slowly to changes in the SNR, especially during high interference when the SNR is low. Under low SNR conditions, the SNR estimates must be heavily filtered to provide acceptable accuracy. The required long filtering time constants make it difficult to get fast-responding accurate estimates of SNR during high interference using a typical time constant filtered estimator.

For the reasons stated above, and for other reasons stated below which will become apparent to those skilled in the art upon reading and understanding the present specification, there is a need in the art for a signal to noise estimator which responds quickly to changes in noise level and provides accurate estimates of signal to noise ratio during periods of high interference.

SUMMARY

The above-mentioned problems and other problems are resolved by the present invention and will be understood by reading and studying the following specification.

In one embodiment, a method for estimating signal/noise ratio is provided. The method comprises calculating a first signal/noise ratio (SNR) estimate using a technique with a first response time, calculating a second SNR estimate using a technique with a second, slower response time, and blending the first SNR estimate with the second SNR estimate.

In another embodiment, a signal/noise ratio (SNR) estimator is provided. The SNR estimator comprises a first calculation circuit adapted to calculate a rapidly responding first SNR estimate, a second calculation circuit adapted to calculate a slower responding and more accurate second SNR estimate, and a filter adapted to filter the first SNR estimate and the second SNR estimate, the filter being further adapted to combine the first and second SNR estimates.

In another embodiment, a computer readable medium having computer-executable instructions for performing a method of estimating signal/noise ratio (SNR) estimates is provided. The method comprises receiving a digital output signal from an automatic gain control (AGC) circuit, calculating a rapidly responding first SNR estimate based on the AGC digital output signal, calculating a slower responding, more accurate second SNR estimate, combining the first and second SNR estimates, and outputting the combined SNR estimate.

In another embodiment, a signal/noise ratio (SNR) estimator is provided. The SNR estimator comprises means for calculating a rapidly responding first SNR estimate, means for calculating a slower responding, more accurate second SNR estimate, and means for combining the first and second SNR estimates.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should also be understood that the exemplary methods illustrated may include additional or fewer steps or may be performed in the context of a larger processing scheme. Moreover, although reference is made in the detailed description of the drawings to Global Positioning Satellite (GPS) receivers and satellites, it will be understood by one of skill in the art that embodiments of the present invention are used in relation to other types of receivers such as AM or FM radio receivers, etc. Furthermore, the methods presented in the drawing figures or the specification are not to be construed as limiting the order in which the individual steps may be performed. The following detailed description is, therefore, not to be taken in a limiting sense.

Embodiments of the present invention take advantage of the accuracy of a time constant filtered estimator and augment it with a faster responding AGC-assisted estimator. Although time constant filtered estimators are accurate, they have a slow response time to changes in noise power, especially in situations when the signal/noise ratio (SNR) is low, due to the required filtering to achieve the desired accuracy. It will be understood by one of skill in the art that the term SNR as utilized herein includes signal-to-noise ratios and carrier-to-noise density ratios. In various situations the SNR may decrease rapidly such as when a GPS signal is being jammed, either accidentally or intentionally. For example, in military applications, an aircraft may be flying toward a target when an enemy begins attempting to jam the GPS signal received by the aircraft. In this situation, the SNR will decrease rapidly. In such situations, an operator needs to be aware of the change in SNR change as soon as possible. However, a typical time constant filtered estimator may take hundreds of seconds to stabilize around an accurate new estimate of SNR depending on the new SNR after jamming. Embodiments of the present invention significantly reduce the response time required to respond to changes in SNRs while taking advantage of the accuracy of time constant filtered estimators.

Figure 1:
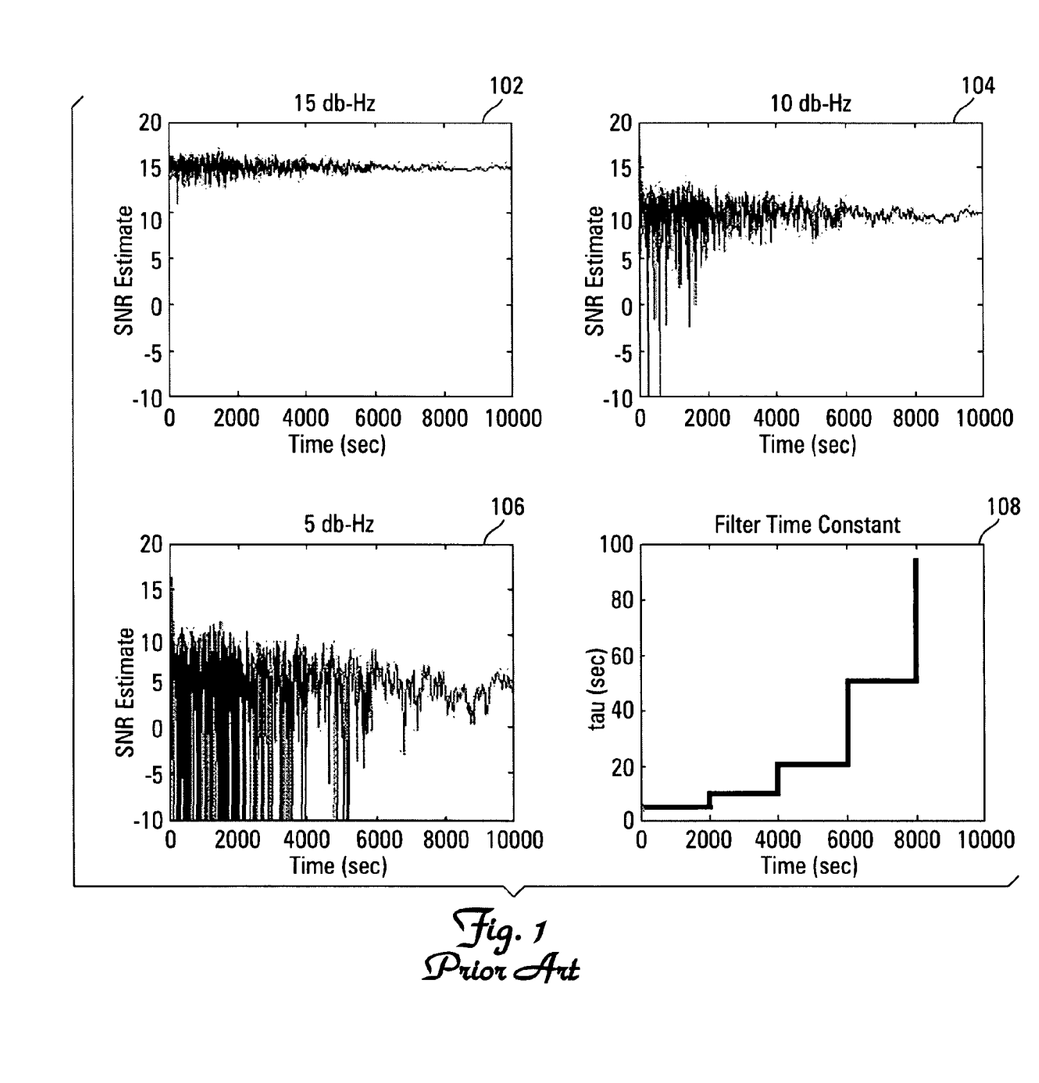
FIG. 1 is a series of charts depicting typical response times for time constant filtered signal/noise ratio estimators to stabilize and produce accurate signal/noise ratio estimates.

FIG. 1 is a series of charts 102-108 depicting typical response times for time constant filtered SNR estimators to stabilize and produce accurate SNR estimates. Charts 102-108 demonstrate the need for large filtering time constants to generate accurate SNR estimates when the actual SNR is low. Typical time constant filtered estimators for GPS receivers estimate the SNR based on baseband measurements provided by the GPS receiver. GPS correlators in the receiver determine the correlation between a GPS receiver input signal and a local replica of the expected input signal maintained by the GPS receiver. The correlators provide outputs of in-phase and quadrature signals, often described as I and Q outputs. The I and Q outputs are provided at multiple delays (prompt, early, late, etc.) of the replica signal relative to the receiver input signal. These in-phase and quadrature signals are the baseband measurements upon which a typical time constant filtered estimator estimates the noise power. Details of the function of typical time constant filtered estimators are known to one of skill in the art and are not addressed herein.

In these estimators, the time constant, $\tau$, used in filtering is based on a current estimate of SNR. At high SNR, little filtering is required and small filter time constants can be used. At low SNR, much filtering is needed to get acceptable accuracy in the SNR estimates, so large time constants—tens of seconds or more—are required. Along the horizontal axis in charts 102-108 is the elapsed time. Along the vertical axis in charts 102-106 is shown exemplary SNR estimates produced by a low pass time constant filtered estimator. Chart 102 is for a true carrier to noise density ratio of 15 dB-Hz; chart 104 is for 10 dB-Hz; and Chart 106 is for 5 dB-Hz. Chart 108 shows a timeline of various choices of the filter time constant, ranging from 5 seconds up to 100 seconds. This filter time constant timeline was used for the estimates shown in Charts 102-106. It can be seen that time constants of tens of seconds are required to get accurate (e.g. within a few dB) SNR estimates when the actual SNR is low. It will be understood by one of skill in the art that, although the values represented in charts 102-108 are exemplary, most time constant filtered estimators exhibit similar responses and characteristics. For example, it will be understood by one of skill in the art that although reference is made to carrier to noise density ratio with respect to charts 102-106, other time constant filtered estimators using other measures of SNR exhibit similar responses and characteristics.

As shown in chart 102 in FIG. 1, the exemplary estimates are relatively accurate at high SNRs, even with a relatively small filter time constant of 5 seconds. However, the exemplary estimates in charts 104 and 106 show that at lower SNRs, time constant filtered estimators require more filtering to produce a relatively accurate estimate of a current SNR. In fact, at the 5 dB-Hz carrier to noise density ratio of chart 106, a relatively long filtering time constant of 50 to 100 seconds is required to provide SNR estimates that are accurate to within a few dB. Hence, time constant filtered estimators require significant amounts of filtering and have a relatively slow response when the SNR is low. Despite the slow response time, time constant filtered estimators are useful because of the accuracy of the estimators once stabilized. Embodiments of the present invention take advantage of this accuracy while also enabling a quicker response to changes in the SNR.

Figure 2:
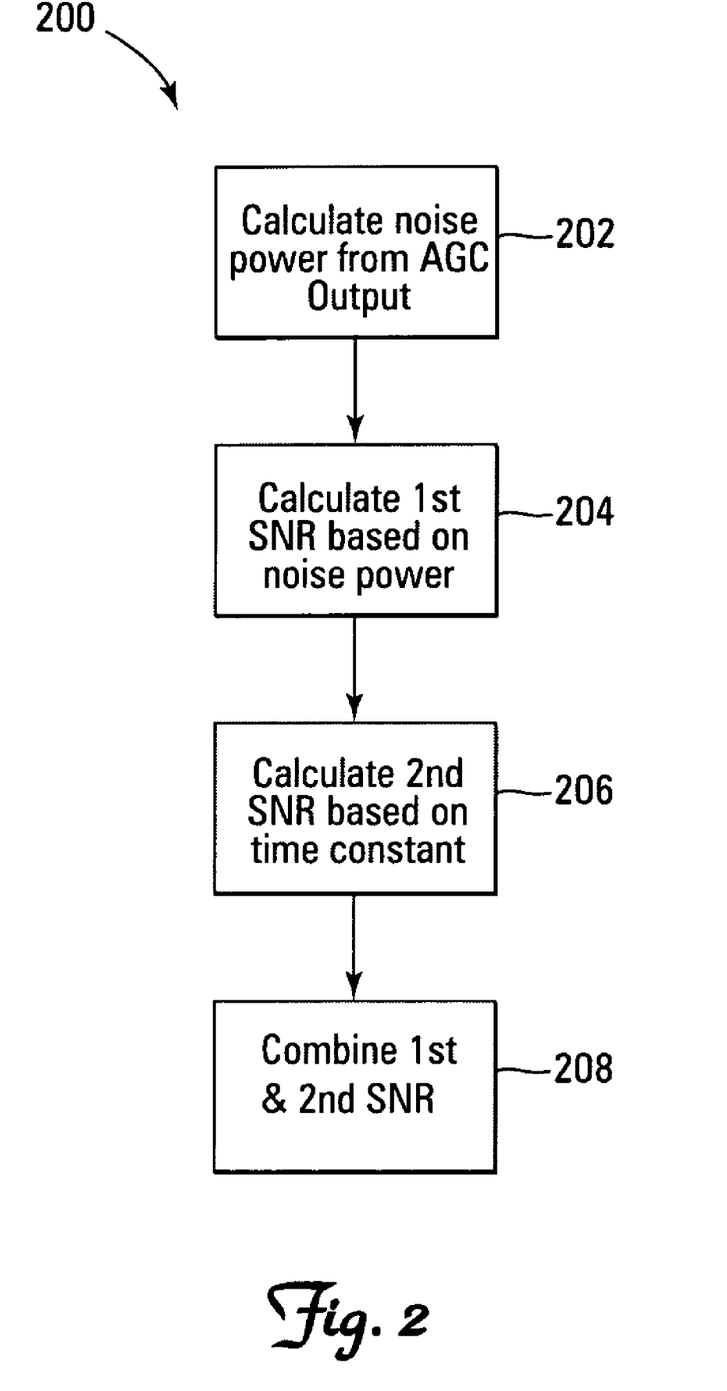
FIG. 2 is a flow chart of a method for improving signal/noise ratio estimates.

FIG. 2 is a flow chart of a method 200 for improving SNR estimates. Although method 200 is discussed herein as proceeding from one step to another step in a serial fashion, it will be understood by one of skill in the art that two or more processes in method 200 occur simultaneously in various embodiments of the present invention. For example, the processes described at 204 and 206 occur simultaneously in some embodiments. At 202, an estimate of noise power is calculated based on an output signal from an automatic gain control (AGC) circuit. The AGC circuit controls an amplifier which amplifies the input signal power to maintain the output signal power level at a constant level despite variations in the input signal's power level. The AGC output provides a measure of the gain being applied to the variable-power-level input signal. The gain applied is a function of the desired constant output power level and the input signal's power level. The AGC circuit responds quickly to variations in the input power level to adjust the gain and maintain the output signal power at a constant level. Therefore, by knowing the gain being applied and the desired constant power level, an estimate of the input signal power level is calculated.

In embodiments dealing with GPS receivers and signals, noise power levels are typically much larger than the GPS signal power. As such, the input signal power level is approximately equal to the noise power level because any effect that the GPS signal power has on the input signal power level and, consequently, AGC output is negligible. Once the noise power is estimated at 202, a first SNR is calculated at 204. In order to calculate the SNR, the carrier signal power must be estimated or known. In some embodiments, the carrier signal power is estimated by assuming a nominal signal power. This assumption is not perfect but sufficiently accurate for many purposes. In other embodiments, the carrier signal power is estimated by modifying an assumed nominal signal power according to various data, such as antenna gain map data, antenna position and attitude data, and satellite position data. The modification of an assumed nominal signal power using such data is described in more detail below with regards to FIG. 4. Although not as accurate at low frequency as a time constant filtered estimator, an AGC estimator, according to embodiments of the present invention, responds nearly instantaneously to changes in noise power. Embodiments of the present invention utilize this quick response time to improve the SNR estimates.

At 206, a second SNR is estimated. In some embodiments, the second SNR is calculated by a time constant filtered estimator as described above. At 208, the first and second SNR estimates are combined. In some embodiments, the first and second SNR estimates are combined by passing the first AGC-based SNR estimate through a high pass filter and the second SNR estimate through a low pass filter. After passing through the filters, the estimates are joined together. The resultant estimate uses the fast response of the AGC estimator for high frequency components and the slower but more accurate estimate from the time constant filtered estimator for low frequency components. Hence the combined estimate has the both the benefit of accuracy from the time constant filtered estimator and the benefit of a quick response from the AGC estimator.

In some such embodiments, the sum of a transfer function for the low pass filter and a transfer function for the high pass filter is 1 over a desired operating frequency range. This type of embodiment is often described as a complementary filter. For example, in some embodiments, the transfer function for the low pass filter is described by the equation $$\frac{1}{\tau_c s + 1}$$

and the transfer function for the high pass filter is described by the equation $$\frac{\tau_c s}{\tau_c s + 1},$$

where $\tau_c$ is the time constant and s is the Laplace transform variable. The fact that the two transfer functions sum to 1 means that the combination of the two estimates covers the whole range of frequencies with unity gain. In other embodiments, the sum of the transfer functions does not equal 1 at all frequencies. For example, in some embodiments, it may be desirable to roll off the frequency response of the combined estimator at very high frequencies where the estimate would be masked by noise.

In other embodiments other means of combining the two estimates are used. For example, in some embodiments, the first and second SNR estimates are combined by weighting and averaging the two estimates. The weighting, in some embodiments, is based on the frequency component being averaged. In some embodiments, the two estimates are only averaged over certain frequencies. In other embodiments, a combination of low and high pass filters are used in conjunction with weighted averages where the two estimates overlap frequencies.

Figure 3:
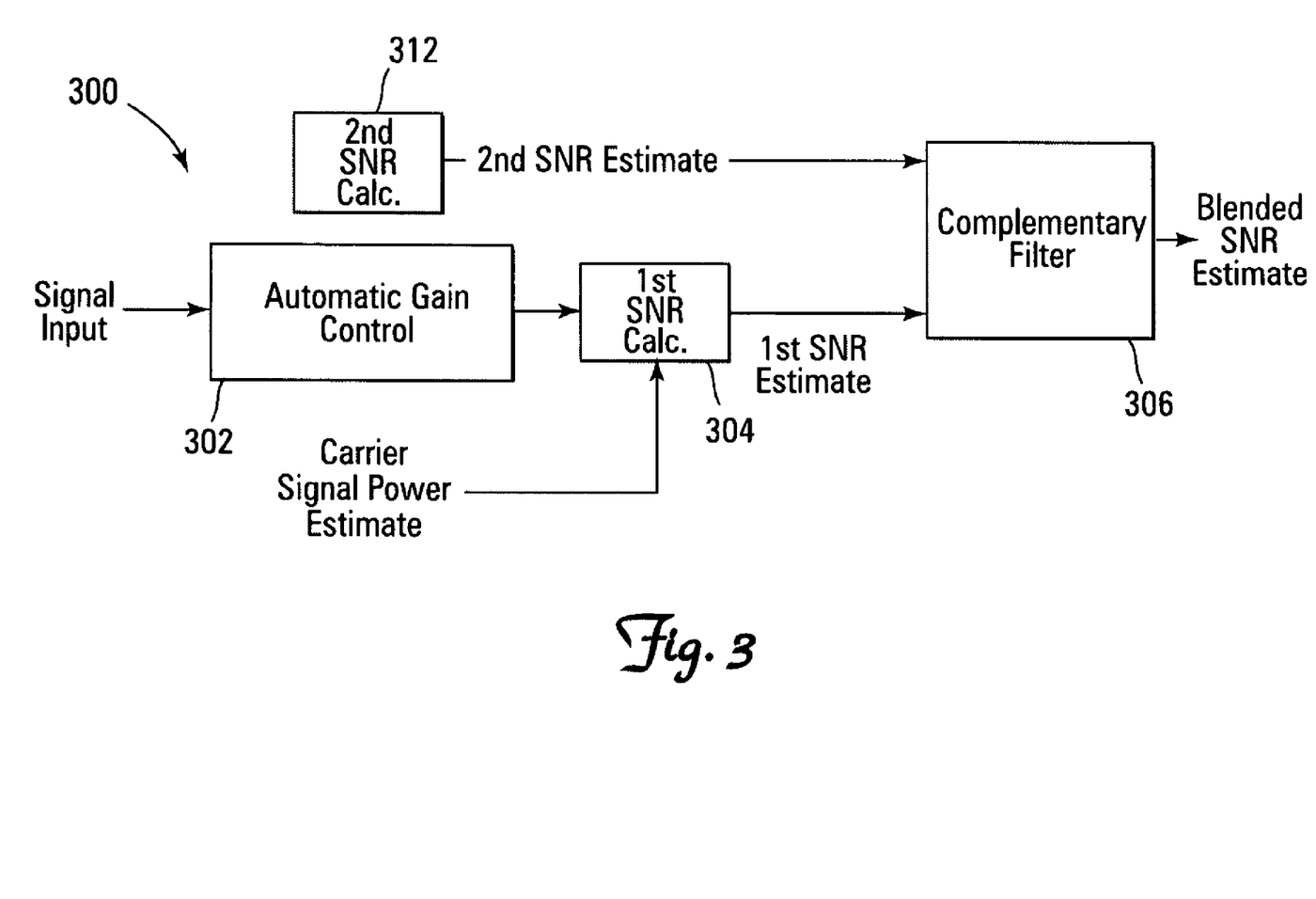
FIG. 3 is a block diagram of an AGC enhanced estimator according to one embodiment of the present invention.

FIG. 3 is a block diagram of an AGC enhanced estimator 300 according to one embodiment of the present invention. Automatic gain control (AGC) circuit 302 is configured to receive an input signal. AGC circuit 302 controls an amplifier or gain element which adjusts the power of the input signal to put the amplified signal in a proper power range for downstream electronic components. The input signal contains both a GPS signal component and a noise component. Because received GPS signals are typically weak, well below the microwatt range, AGC circuit 302 typically only responds to the stronger noise signal. The AGC response to noise changes is in the range of milliseconds. First SNR calculator 304 receives the AGC output which is a function of noise power and indicates the gain being applied to the input signal. First SNR calculator 304 also receives a carrier signal power estimate. In some embodiments, the carrier signal power estimate is an assumed nominal carrier signal power. The carrier signal power level can be assumed based on typical past carrier signal power levels and based on knowledge of typical default transmission power levels of a typical satellite. The actual carrier signal power will vary based on path attenuation between the satellite and receiver, age of the satellite, antenna gain in the direction of the satellite, and other factors known to one of skill in the art. The assumed nominal power is sufficiently accurate for most applications because variations due to attenuation, age, etc. are typically not relatively significant. In other embodiments, however, a more accurate estimate of carrier signal power is calculated based on various data obtained by the receiver as described below with respect to FIG. 4.

First SNR calculator 304 calculates a first SNR estimate based on the AGC output and the assumed nominal carrier signal power through equations known to one of skill in the art. Due to the fast response of AGC circuit 302 to changes in noise power, the first SNR estimate is calculated relatively quickly by first SNR estimator 304. The first SNR estimate is sufficiently accurate to place the SNR estimate values within the proper range of SNR values. However, it is not as accurate as a slower second estimate from second SNR calculator 312. The first SNR estimate is then passed to complementary filter 306. Complementary filter 306 also receives the second slower responding SNR estimate from second SNR calculator 312. In some embodiments, second SNR calculator 312 is a time constant filtered estimator as described above. The second SNR estimate is more accurate than the first SNR estimate but responds slower to changes in SNR values. Complementary filter 306 combines the first and second SNR estimates such that a blended SNR estimate output by complementary filter 306 responds quickly to changes in SNR values and has the accuracy of a time constant filtered estimator. One embodiment of complementary filter 306 is described in more detail below with regards to FIG. 5.

Figure 4:
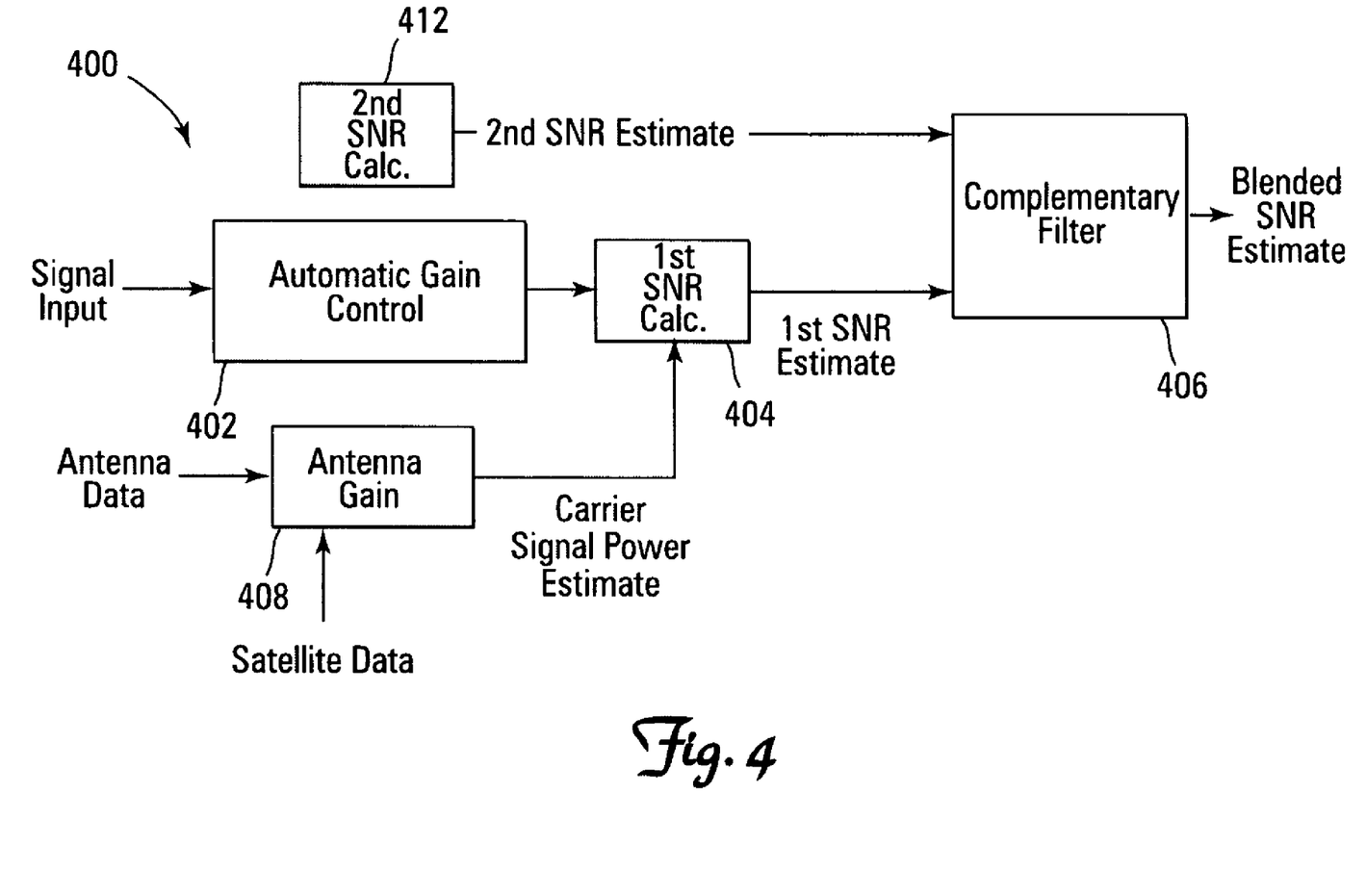
FIG. 4 is a block diagram of another AGC enhanced estimator according to one embodiment of the present invention.

FIG. 4 is a block diagram of another AGC enhanced estimator 400 according to one embodiment of the present invention. AGC estimator 400 includes AGC circuit 402, first SNR calculator 404, second SNR calculator 412, complementary filter 406 and antenna gain calculator 408. The functions of AGC circuit 402, first SNR calculator 404, second SNR calculator 412 and complementary filter 406 are described above with respect to FIG. 3. Antenna gain calculator 408 modifies an assumed nominal carrier signal power based on various data obtained regarding the receiver antenna and a signal transmission source. In some embodiments, the signal transmission source is a satellite. This data includes, but is not limited to, position of the signal transmission source and antenna in a universal reference frame, antenna attitude, and antenna gain map data. In some embodiments, such as those involving satellites, the universal reference frame is typically an earth centered earth fixed (ECEF) reference frame. Antenna gain map data is obtained from at least one of factory calibration and antenna design characteristics. In some embodiments, the antenna gain map data is stored in memory of antenna gain calculator 408 as a tabulated list correlating antenna gain with particular directions relative to an antenna-fixed coordinate system.

Signal transmission source position and antenna position in a universal reference frame are known. For example, satellite and antenna position in an earth centered earth fixed (ECEF) frame of reference are known to GPS quality accuracy, on the order of meters to tens of meters. Based on the known positions, antenna gain calculator 408 calculates a directional unit vector from the antenna to the signal transmission source. In some embodiments, antenna gain calculator 408 first calculates a directional unit vector from the antenna to the signal transmission source in the universal frame. Then antenna gain calculator 408 rotates the calculated directional unit vector to a directional unit vector in the antenna's frame of reference using measured antenna attitude with respect to the universal reference frame. Based on the directional unit vector in the antenna's frame of reference, antenna gain calculator 408 retrieves antenna gain data from the stored antenna gain map. Antenna gain calculator 408 then modifies the assumed nominal signal power with the antenna gain data obtained from the antenna gain map.

Embodiments of the present invention which include antenna gain calculator 408 provide more accurate estimates of signal power because they account for changes in attitude of the antenna. For example, an antenna located on the surface of an aircraft is able to receive varying levels of signal power based on the attitude of the aircraft. If the aircraft is inverted, the antenna will receive much less signal power from a satellite than if the aircraft is upright. Without antenna gain calculator 408, the same assumed nominal signal power is used for both orientations of the aircraft. However, with antenna gain calculator 408, the estimated signal power accounts for the attitude of the aircraft by modifying the assumed nominal signal power with the antenna gain data obtained from the antenna gain map.

Figure 5:
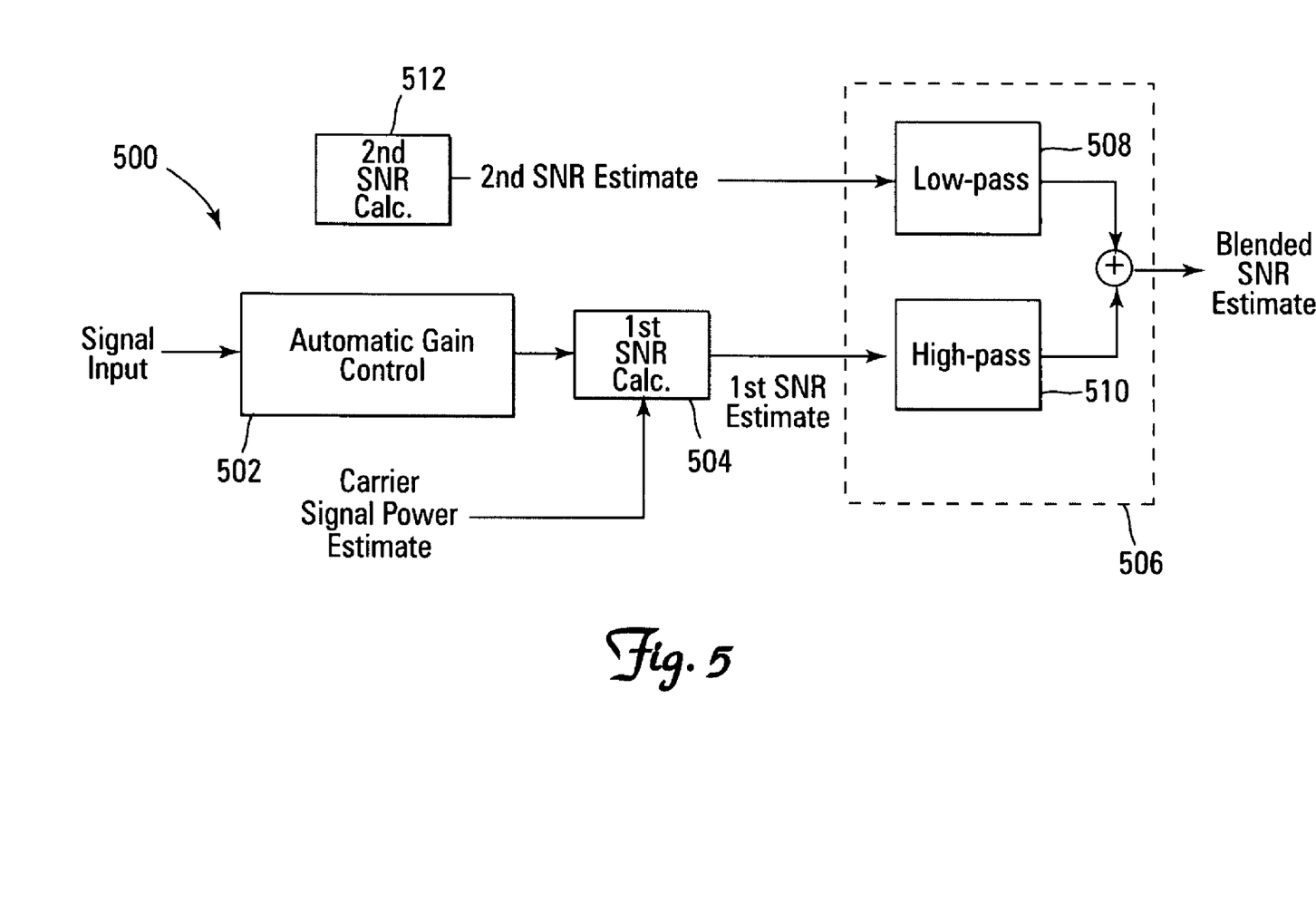
FIG. 5 is a block diagram of another AGC enhanced estimator according to one embodiment of the present invention.

FIG. 5 is a block diagram of another AGC enhanced estimator 500 according to one embodiment of the present invention. AGC estimator 500 includes one embodiment of complementary filter 506. In this embodiment, complementary filter 506 comprises low-pass filter 508 and high-pass filter 510 for combining the two estimates. In other embodiments, other means are used in complementary filter 506 for combining the two estimates. The first SNR estimate calculated by first SNR calculator 504 is received by high-pass filter 510. High-pass filter 510 allows high frequency values of the first SNR estimate to pass and blocks the low frequency values. The second SNR estimate calculated by second SNR calculator 512 is received by low-pass filter 508. Low-pass filtering allows components in the low frequency range of the second SNR estimate to pass and blocks components in the high frequencies. Complementary filter 506 then combines the low frequency components of the second SNR estimate and the high frequency components of the first SNR estimate into one blended SNR estimate.

In some embodiments, the transfer function for low-pass filter 508 and the transfer function for high-pass filter 510 sum to 1 over a desired operating frequency range. In such embodiments, the blended SNR estimate covers the whole range of frequencies of the two SNR estimates with unity gain. In other embodiments, the transfer functions do not sum to 1, hence, not covering the whole range of frequencies with unity gain. In other embodiments, the low-frequency component passed by low-pass filter 508 and the high-frequency component passed by high-pass filter 510 overlap. The overlap is controlled by the transfer function chosen for both low-pass filter 508 and high-pass filter 510. In other embodiments the low frequency component and the high frequency component do not overlap. The blended SNR estimate exhibits both the low frequency accuracy of a time constant filtered estimator and the fast response of an AGC assisted estimator.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for estimating signal/noise ratio, the method comprising:
    calculating a first signal/noise ratio (SNR) estimate using a technique with a first response time;
    calculating a second SNR estimate using a technique with a second, slower response time;
    blending the first SNR estimate with the second SNR estimate; and
    outputting the blended SNR estimate.

2. The method of claim 1, wherein calculating a first SNR estimate further comprises:
    calculating a noise power estimate based on an output signal from an automatic gaincontrol circuit.

3. The method of claim 1, wherein calculating a first SNR estimate includes one of:
    assuming a nominal signal power; and
    calculating a signal power estimate.

4. The method of claim 3, wherein calculating a signal power estimate comprises:
    calculating a directional unit vector from an antenna to a signal transmission source;
    retrieving antenna gain data from an antenna gain map based on the calculated directional unit vector; and
    modifying the assumed nominal signal power with the antenna gain data obtained from the antenna gain map.

5. The method of claim 4, wherein calculating a directional unit vector from an antenna to a signal transmission source comprises:
    measuring antenna attitude with respect to a universal reference frame;
    calculating a directional unit vector from the antenna to a signal transmission source in the universal reference frame; and
    rotating the directional unit vector from the universal reference frame to the antenna's frame of reference.

6. The method of claim 1, wherein blending the first SNR estimate with the second SNR estimate includes:
    passing the second SNR estimate through a low-pass filter; and
    passing the first SNR estimate through a high-pass filter.

7. The method of claim 6, further comprising:
    selecting a first transfer function for the low-pass filter and a second transfer function for the high-pass filter such that the sum of the first and second transfer functions is 1 over a desired operating frequency range.

8. A signal/noise ratio (SNR) estimator comprising:
    a first calculation circuit configured to calculate a rapidly responding first SNR estimate;
    a second calculation circuit configured to calculate a slower responding and more accurate second SNR estimate; and
    a filter configured to filter the first SNR estimate and the second SNR estimate, the filter being further configured to combine the first and second SNR estimates.

9. The signal/noise ratio estimator of claim 8, further comprising:
    an automatic gain control (AGC) circuit configured to output a signal as a function of noise power, wherein the first calculation circuit calculates a rapidly responding SNR based on the AGC circuit output.

10. The signal/noise ratio estimator of claim 8, further comprising:
    an antenna gain calculator for calculating a carrier signal power estimate.

11. The signal/noise ratio estimator of claim 10, wherein the antenna gain calculator is configured to calculate a directional unit vector from a receiving antenna to a signal transmission source, retrieve antenna gain data from an antenna gain map based on the calculated directional unit vector, and modify an assumed nominal carrier signal power with the antenna gain data obtained from the antenna gain map.

12. The signal/noise ratio estimator of claim 11, wherein the antenna gain calculator is further configured to measure the antenna attitude with respect to a universal reference frame, calculate a directional unit vector from the antenna to the signal transmission source in the universal reference frame, and rotate the directional unit vector from the universal reference frame to the antenna's frame of reference.

13. The signal/noise ratio estimator of claim 11, wherein the signal transmission source is a satellite and the universal reference frame is an earth centered earth fixed reference frame.

14. The signal/noise ratio estimator of claim 8, wherein the filter further comprises:
   a low-pass filter for filtering the second SNR estimate;
   a high-pass filter for filtering the first SNR estimate; and
   a combiner circuit for combining the outputs of the low-pass filter and the high-pass filter.

15. The signal/noise ratio estimator of claim 14, wherein the sum of a first transfer function for the low-pass filter and a second transfer function for the high-pass filter is 1 over a desired operating frequency range of the SNR estimator.

16. A computer readable medium having computer-executable instructions for performing a method of estimating signal/noise ratio (SNR) estimates, the method comprising:
   receiving a digital output signal from an automatic gain control (AGC) circuit;
   calculating a rapidly responding first SNR estimate based on the AGC digital output signal;
   calculating a slower responding, more accurate second SNR estimate;
   combining the first and second SNR estimates; and
   outputting the combined SNR estimate.

17. The computer readable medium of claim 16, wherein combining the first and second SNR estimates includes:
   filtering the first SNR estimate with a high-pass filter;
   filtering the second SNR estimate with a low-pass filter; and
   combining the filtered first and second SNR estimates.

18. The computer readable medium of claim 17, further comprising:
   selecting a first transfer function for the low-pass filter and a second transfer function for the high-pass filter such that the sum of the first and second transfer functions is 1.

19. The computer readable medium of claim 16, further comprising one of:
   calculating a carrier signal power estimate; and
   assuming a nominal carrier signal power estimate.

20. The computer readable medium of claim 19, wherein calculating a carrier signal power estimate comprises:
   calculating a directional unit vector from an antenna to a signal transmission source;
   retrieving antenna gain data from an antenna gain map based on the calculated directional unit vector; and
   modifying an assumed nominal carrier signal power with the antenna gain data obtained from the antenna gain map.

21. The computer readable medium of claim 20, wherein calculating a directional unit vector from an antenna to a signal transmission source comprises:
   receiving antenna attitude data;
   calculating a directional unit vector from the antenna to a signal transmission source in a universal reference frame; and
   rotating the directional unit vector from the universal reference frame to the antenna's frame of reference.

22. A signal/noise ratio (SNR) estimator comprising;
   means for calculating a rapidly responding first SNR estimate;
   means for calculating a slower responding, more accurate second SNR estimate; and
   means for combining the first and second SNR estimates; and
   means for outputting the combined SNR estimate.

23. The signal/noise ratio estimator of claim 22, further comprising:
   means for calculating a noise power estimate based on an output from an automatic gain control circuit; and
   means for calculating a carrier signal power estimate, wherein the carrier signal power estimate and noise power estimate are used by the means for calculating a rapidly responding first SNR estimate.

24. The signal/noise ratio estimator of claim 23, wherein the means for calculating a carrier signal power estimate further comprises:
   means for calculating a directional unit vector from a receiving antenna to a signal transmission source and retrieving antenna gain data based on the calculated directional unit vector; and
   means for modifying an assumed nominal carrier signal power with the antenna gain data.

* * * * *